US012805146B2

(12) United States Patent
Yoon et al.

(10) Patent No.: US 12,805,146 B2
(45) Date of Patent: Nov. 17, 2026

(54) DISPLAY APPARATUS

(71) Applicant: Samsung Display Co., Ltd., Yongin-Si (KR)

(72) Inventors: Seokgyu Yoon, Yongin-si (KR); Sujeong Kim, Yongin-si (KR); Jinsoo Jung, Yongin-si (KR); Sunghan Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 317 days.

(21) Appl. No.: 18/406,227

(22) Filed: Jan. 8, 2024

(65) Prior Publication Data

US 2024/0237468 A1 Jul. 11, 2024

(30) Foreign Application Priority Data

Jan. 9, 2023 (KR) ........................ 10-2023-0003045

(51) Int. Cl.

| | |
|---|---|
| ***H10K 59/38*** | (2023.01) |
| ***H10K 59/122*** | (2023.01) |
| ***H10K 59/126*** | (2023.01) |
| ***H10K 59/60*** | (2023.01) |
| *H10K 59/13* | (2023.01) |

(52) U.S. Cl.

CPC ........... *H10K 59/38* (2023.02); *H10K 59/122* (2023.02); *H10K 59/126* (2023.02); *H10K 59/60* (2023.02); *H10K 59/13* (2023.02)

(58) Field of Classification Search

CPC .... H10K 59/38; H10K 59/122; H10K 59/126; H10K 59/60; H10K 59/65; H10K 59/40; H10K 59/12; H10K 59/50; H10K 59/872; H10K 59/8792; H10K 59/90; H10K 59/13

See application file for complete search history.

(56) References Cited

U.S. PATENT DOCUMENTS

| | | | | |
|---|---|---|---|---|
| 10,296,114 | B2 | 5/2019 | Lee et al. | |
| 11,543,904 | B2 | 1/2023 | Bok et al. | |
| 2020/0111851 | A1 * | 4/2020 | Park | G06F 21/32 |
| 2021/0066669 | A1 * | 3/2021 | Kubota | H10K 59/353 |
| 2022/0173174 | A1 | 6/2022 | Hatsumi et al. | |
| 2022/0246893 | A1 * | 8/2022 | Hatsumi | H10K 59/8792 |
| 2022/0278177 | A1 | 9/2022 | Kubota et al. | |
| 2022/0285460 | A1 * | 9/2022 | Kim | H10K 59/873 |

(Continued)

FOREIGN PATENT DOCUMENTS

| | | | | |
|---|---|---|---|---|
| DE | 112019006497 T5 * | 11/2021 | | H05B 33/14 |
| DE | 112020000840 T5 * | 11/2021 | | G06F 3/0421 |

(Continued)

*Primary Examiner* — Ida M Soward

(74) *Attorney, Agent, or Firm* — Innovation Counsel LLP

(57) ABSTRACT

A display apparatus includes a substrate, a first organic light-emitting diode corresponding to the first emission area, a first photodetector corresponding to the first sensing area, a light-blocking layer including a first light-blocking layer opening overlapping the first emission area and a second light-blocking layer opening overlapping the first sensing area, a low reflection layer under the light-blocking layer, a first color filter filling the first light-blocking layer opening, and a second color filter filling the second light-blocking layer opening, wherein the light-blocking layer and the low reflection layer overlap each other.

20 Claims, 7 Drawing Sheets

(56) References Cited

U.S. PATENT DOCUMENTS

| | | | | |
|---|---|---|---|---|
| 2022/0293683 | A1* | 9/2022 | Kang | H10K 59/38 |
| 2022/0359628 | A1* | 11/2022 | Choi | G06F 3/0412 |

FOREIGN PATENT DOCUMENTS

| | | | | | |
|---|---|---|---|---|---|
| EP | 3425670 | A1 | * | 1/2019 | H10K 39/34 |
| JP | 2016-105134 | A | | 6/2016 | |
| KR | 10-1074799 | B1 | | 10/2011 | |
| KR | 10-2020-0054959 | A | | 5/2020 | |
| KR | 10-2021-0086907 | A | | 7/2021 | |
| KR | 10-2021-0126649 | A | | 10/2021 | |
| KR | 10-2022-0033489 | A | | 3/2022 | |
| KR | 20220030004 | A | * | 3/2022 | G02B 5/201 |
| KR | 10-2022-0125839 | A | | 9/2022 | |
| KR | 10-2022-0152591 | A | | 11/2022 | |
| WO | WO-2020053692 | A1 | * | 3/2020 | H05B 33/22 |
| WO | WO-2020075009 | A1 | * | 4/2020 | H05B 33/14 |
| WO | WO-2020165686 | A1 | * | 8/2020 | G06F 3/0421 |
| WO | 2021-009638 | A1 | | 1/2021 | |

* cited by examiner

DISPLAY APPARATUS

CROSS-REFERENCE TO RELATED APPLICATION

This application is based on and claims priority under 35 U.S.C. § 119 to Korean Patent Application No. 10-2023-0003045, filed on Jan. 9, 2023, in the Korean Intellectual Property Office, the disclosure of which is incorporated by reference herein in its entirety.

BACKGROUND

1. Field

One or more embodiments relate to the structure of a display apparatus.

2. Description of the Related Art

In general, a display apparatus includes a display element, such as an organic light-emitting diode, and a thin-film transistor on a substrate, and operates by causing display elements to emit light.

More specifically, each pixel of the display apparatus has a display element, such as an organic light-emitting diode, in which an intermediate layer including an emission layer is disposed between a pixel electrode and an opposite electrode. In the display apparatus, whether or not to emit light or the degree of light emission of each pixel is generally controlled through the thin-film transistor electrically connected to the pixel electrode. Some layers included in the intermediate layer of such a display element are commonly provided for a plurality of display elements.

SUMMARY

One or more embodiments include a display apparatus including a photodetector with improved detectability. However, such a feature is an example, and one or more embodiments are not limited thereto.

Additional aspects will be set forth in part in the description which follows and, in part, will be apparent from the description, or may be learned by practice of the presented embodiments of the disclosure.

According to one or more embodiments, a display apparatus includes a substrate, a first organic light-emitting diode, a first photodetector, a light-blocking layer, a low reflection layer, a first color filter, and a second color filter. The substrate includes a first emission area and a first sensing area. The first organic light-emitting diode is above the substrate and emits light in correspondence with the first emission area. The first photodetector is above the substrate and detects light in correspondence with the first sensing area. The light-blocking layer is above the first organic light-emitting diode and the first photodetector and includes a first light-blocking layer opening overlapping the first emission area and a second light-blocking layer opening overlapping the first sensing area. The low reflection layer is above the first organic light-emitting diode and the first photodetector and under the light-blocking layer. The first color filter is on the light-blocking layer and fills the first light-blocking layer opening. The second color filter is on the light-blocking layer and fills the second light-blocking layer opening. The light-blocking layer and the low reflection layer overlap each other.

A top surface of the low reflection layer may be in direct contact with a bottom surface of the light-blocking layer.

The low reflection layer may include a first low reflection layer opening overlapping the first light-blocking layer opening and a second low reflection layer opening overlapping the second light-blocking layer opening.

The first light-blocking layer opening and the first low reflection layer opening may have a same area as each other, and the second light-blocking layer opening and the second low reflection layer opening may have a same area as each other.

The low reflection layer may have a surface reflectance lower than a surface reflectance of the light-blocking layer.

The low reflection layer may be a third color filter that absorbs light in a wavelength range different from a wavelength range of the first color filter and a wavelength range of the second color filter.

The low reflection layer may be a blue color filter that is capable of transmitting light in a wavelength band of 380 nm to 495 nm.

The low reflection layer may include a first pigment, wherein the first pigment may include at least one of C. I. Pigment Blue 15, 15:1, 15:2, 15:3, 15:4, and 15:6.

The low reflection layer may further include a second pigment, wherein the second pigment may include at least one of C. I. Pigment Violet 1, 19, 23, 27, 29, 30, 32, 37, 40, 42, and 50.

The first color filter and the second color filter may transmit light of a same color.

The first color filter and the second color filter may be green color filters that transmit light in a wavelength band of 495 nm to 600 nm.

An area of the first light-blocking layer opening may be the same as an area of the second light-blocking layer opening.

An area of the first light-blocking layer opening may be greater than an area of the second light-blocking layer opening.

The display apparatus may further include a bank layer including a first bank layer opening overlapping the first light-blocking layer opening and a second bank layer opening overlapping the second light-blocking layer opening.

An end of the light-blocking layer surrounding the second light-blocking layer opening and facing the second light-blocking layer opening may protrude farther inward into the first sensing area than an end of the bank layer surrounding the second bank layer opening and facing the second bank layer opening in a cross-sectional view.

The end of the light-blocking layer protrudes farther inward into the first sensing area than the end of the bank layer in the cross-sectional view by 4 μm to 5 μm.

A thickness of the low reflection layer may be 0.1 μm to 10 μm.

A refractive index of the low reflection layer may be 1.5 to 2.0.

The first organic light-emitting diode may emit green light in a wavelength band of 495 nm to 580 nm, and the first photodetector may detect green light in the wavelength band of 495 nm to 580 nm.

The display apparatus may further include an adhesive member on the first color filter and the second color filter, and a cover window on the adhesive member.

BRIEF DESCRIPTION OF THE DRAWINGS

The above and other aspects, and features of certain embodiments of the disclosure will be more apparent from the following description taken in conjunction with the accompanying drawings.

DETAILED DESCRIPTION

Figure 1:
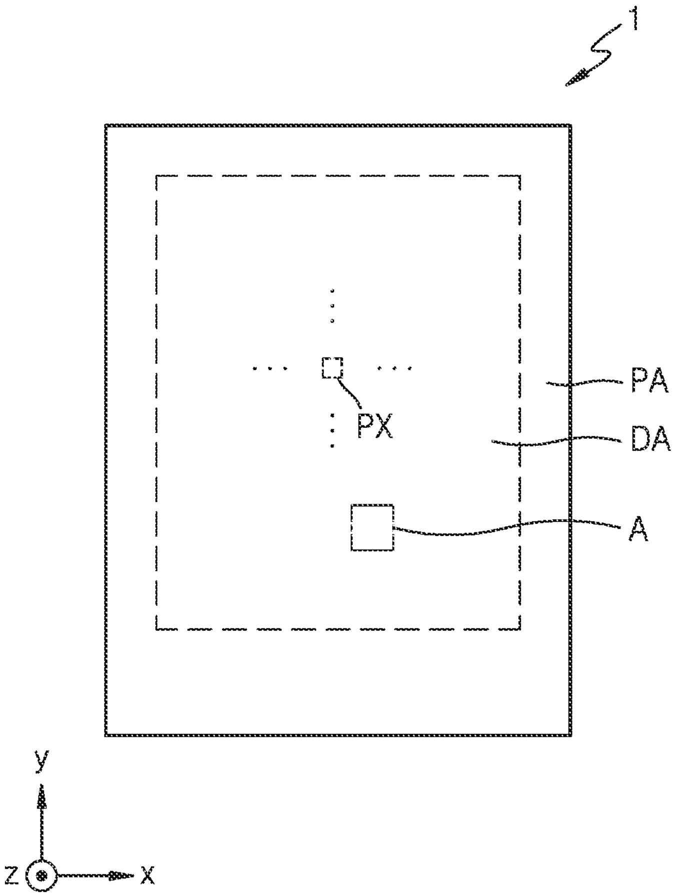
FIG. 1 is a schematic plan view of a portion of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in the written description. Effects and features of one or more embodiments and methods of accomplishing the same will become apparent from the following detailed description of the one or more embodiments, taken in conjunction with the accompanying drawings. However, the present embodiments may have different forms and should not be construed as being limited to the descriptions set forth herein.

One or more embodiments will be described below in more detail with reference to the accompanying drawings. Those elements that are the same or are in correspondence with each other are rendered the same reference numeral regardless of the figure number, and redundant descriptions thereof are omitted.

While such terms as "first" and "second" may be used to describe various elements, such elements must not be limited to the above terms. The above terms are used only to distinguish one element from another.

The singular forms "a," "an," and "the" as used herein are intended to include the plural forms as well unless the context clearly indicates otherwise.

It will be understood that the terms "include," "comprise," and "have" as used herein specify the presence of stated features or elements but do not preclude the addition of one or more other features or elements.

It will be further understood that, when a layer, region, or element is referred to as being on another layer, region, or element, it may be directly or indirectly on the other layer, region, or element. That is, for example, intervening layers, regions, or elements may be present.

Sizes of elements in the drawings may be exaggerated or reduced for convenience of explanation. For example, since sizes and thicknesses of elements in the drawings are arbitrarily illustrated for convenience of explanation, the following embodiments are not limited thereto.

When an embodiment may be implemented differently, a certain process order may be performed differently from the described order. For example, two consecutively described processes may be performed substantially at the same time or performed in an order opposite to the described order.

It will be further understood that, when layers, regions, or elements are referred to as being connected to each other, they may be directly connected to each other or may be indirectly connected to each other with intervening layers, regions, or elements therebetween. For example, when layers, regions, or elements are referred to as being electrically connected to each other, they may be directly electrically connected to each other or may be indirectly electrically connected to each other with intervening layers, regions, or elements therebetween.

FIG. 1 is a schematic plan view of a portion of a display apparatus 1 according to an embodiment.

As shown in FIG. 1, the display apparatus 1 may include a display area DA in which a plurality of pixels PX are located and a peripheral area PA located outside the display area DA. More specifically, the peripheral area PA may entirely surround the display area DA. This may be understood as meaning that a substrate 100, e.g., refer to FIG. 5, included in the display apparatus 1 has the display area DA and the peripheral area PA.

Each pixel PX of the display apparatus 1 refers to a minimum unit for displaying an image, and the display apparatus 1 may display a desired image through a combination of the plurality of pixels PX. More specifically, each pixel PX may emit light of a certain color, and the display apparatus 1 may display a desired image by using light emitted from pixels PX. For example, each pixel PX may emit red light, green light, or blue light. Each pixel PX may include a display element, such as an organic light-emitting diode. The pixel PX may be connected to a pixel circuit including a thin-film transistor and a storage capacitor.

As shown in FIG. 1, the display area DA may have a polygonal shape including a quadrilateral shape. For example, the display area DA may have a rectangular shape having a horizontal length greater than a vertical length, a rectangular shape having a horizontal length less than a vertical length, or a square shape. Alternatively, the display area DA may have various shapes, such as an oval shape or a circular shape.

The peripheral area PA may be a non-display area in which pixels PX are not arranged. A driver for providing electrical signals or power to pixels PX may be located in the peripheral area PA. Pads (not shown) to which various electronic devices or printed circuit boards may be electrically connected may be located in the peripheral area PA. Each pad may be apart from each other in the peripheral area PA and may be electrically connected to a printed circuit board or an integrated circuit device.

Figure 2:
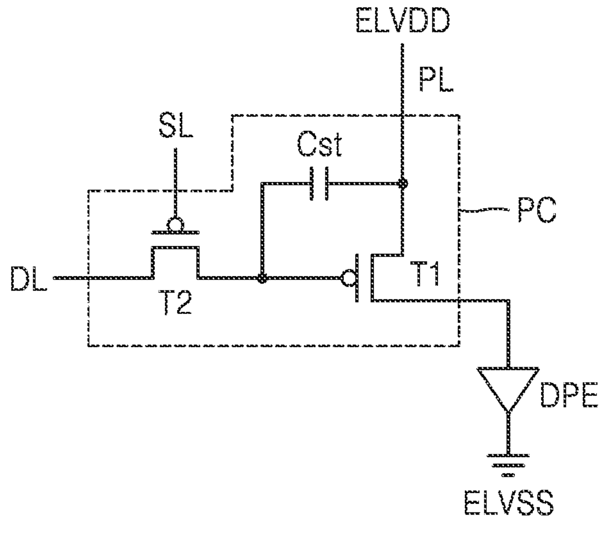
FIG. 2 is an equivalent circuit diagram of a pixel circuit electrically connected to a display element included in a pixel of the display apparatus of FIG. 1.

FIG. 2 is an equivalent circuit diagram of a pixel circuit PC electrically connected to a display element DPE included in a pixel PX of the display apparatus 1 of FIG. 1.

The pixel circuit PC may include a first transistor T1, a second transistor T2, and a storage capacitor Cst. The second transistor T2, which is a switching transistor, may be connected to a scan line SL and a data line DL and may be turned on by a switching signal input from the scan line SL to transmit a data signal input from the data line DL to the first transistor T1. The storage capacitor Cst may have one end electrically connected to the second transistor T2 and the other end electrically connected to a driving voltage line PL and may store a voltage corresponding to a difference between a voltage received from the second transistor T2 and a driving power voltage ELVDD supplied to the driving voltage line PL.

The first transistor T1, which is a driving transistor, may be connected to the driving voltage line PL and the storage capacitor Cst and may be configured to control the amount of a driving current flowing from the driving voltage line PL to the display element DPE, in response to a voltage value stored in the storage capacitor Cst. The display element DPE may emit light having a certain brightness according to the driving current. An opposite electrode of the display element DPE may receive an electrode power voltage ELVSS.

Although FIG. 2 illustrates the pixel circuit PC including two transistors and one storage capacitor, one or more embodiments are not limited thereto. For example, the number of transistors or the number of storage capacitors may be variously modified according to the design of the pixel circuit PC.

Figure 3:
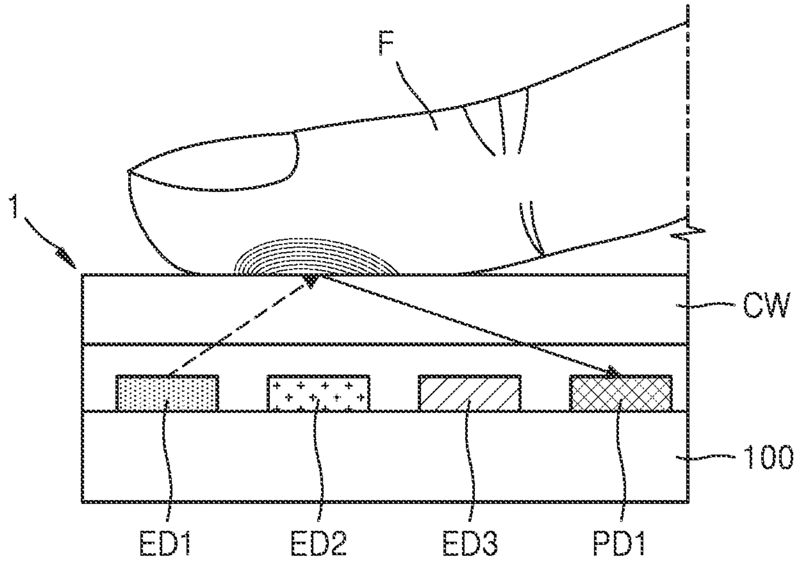
FIG. 3 is a schematic cross-sectional view of a display apparatus according to an embodiment.

FIG. 3 is a schematic cross-sectional view of the display apparatus 1 according to an embodiment.

Referring to FIG. 3, the display apparatus 1 according to an embodiment may include a first organic light-emitting diode ED1, a second organic light-emitting diode ED2, a third organic light-emitting diode ED3, and a first photodetector PD1. The first organic light-emitting diode ED1, the second organic light-emitting diode ED2, and the third organic light-emitting diode ED3 may emit light of different colors from one another. For example, the first organic light-emitting diode ED1 may emit green light, the second organic light-emitting diode ED2 may emit red light, and the third organic light-emitting diode ED3 may emit blue light.

As shown in FIG. 3, the display apparatus 1 may have the function of sensing an object in contact with a cover window CW, for example, a fingerprint of a finger F. Among light emitted from at least one of the first organic light-emitting diode ED1, the second organic light-emitting diode ED2, and the third organic light-emitting diode ED3, at least a portion of reflected light reflected from a user's fingerprint may be re-incident on the first photodetector PD1. Thus, the first photodetector PD1 may detect the reflected light. For example, green light emitted from the first organic light-emitting diode ED1 may be reflected from an object in contact with the cover window CW and be re-incident on the first photodetector PD1. Thus, the first photodetector PD1 may detect the re-incident green light.

Figure 4:
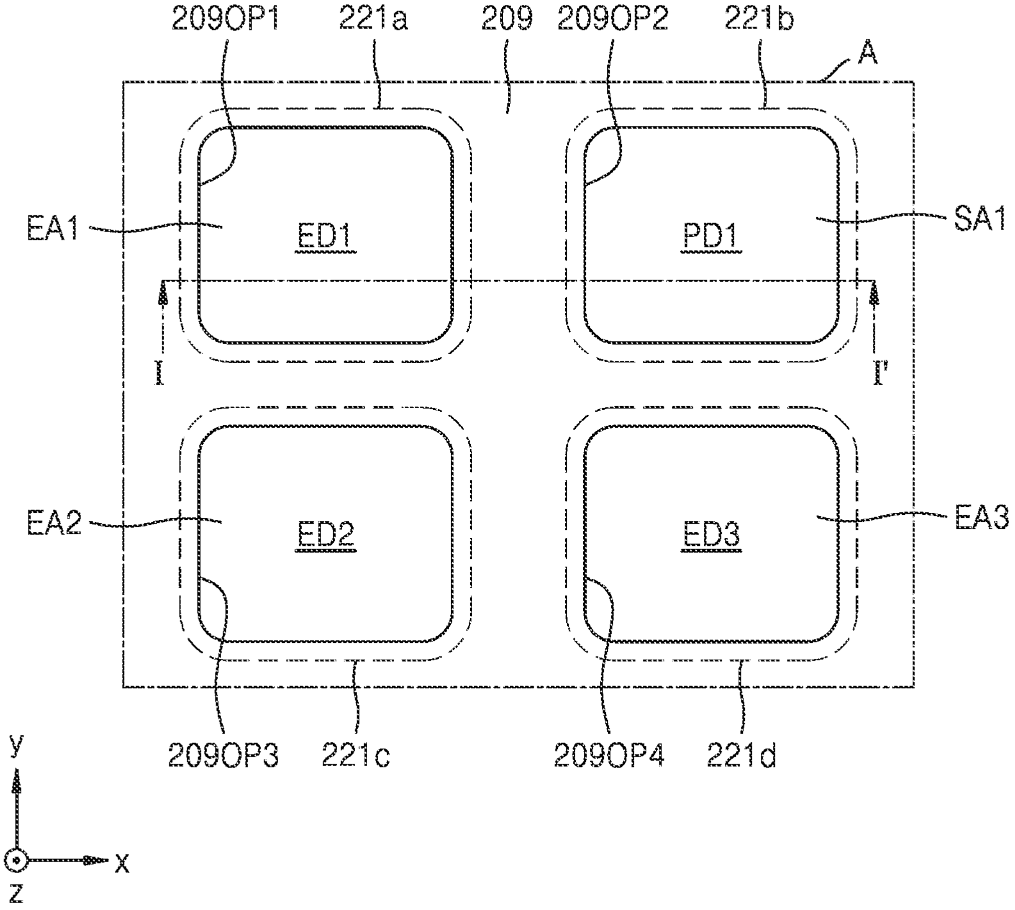
FIG. 4 is a schematic plan view of a portion of a display apparatus according to an embodiment.

FIG. 4 is a schematic plan view of a portion of the display apparatus 1 according to an embodiment. More specifically, FIG. 4 is an enlarged plan view schematically showing region A of FIG. 1. In FIG. 4, a plan view over a bank layer 209 is illustrated for convenience.

As shown in FIG. 4, the display apparatus 1 may include a plurality of organic light-emitting diodes and a photodetector. The plurality of organic light-emitting diodes may include the first organic light-emitting diode ED1, the second organic light-emitting diode ED2, and the third organic light-emitting diode ED3, and the photodetector may include the first photodetector PD1. The first organic light-emitting diode ED1, the second organic light-emitting diode ED2, and the third organic light-emitting diode ED3 may emit light of different colors from one another. For example, the first organic light-emitting diode ED1 may emit green light, the second organic light-emitting diode ED2 may emit red light, and the third organic light-emitting diode ED3 may emit blue light. The red light may be light in a wavelength band of 580 nm to 780 nm, the blue light may be light in a wavelength band of 380 nm to 495 nm, and the green light may be light in a wavelength band of 495 nm to 580 nm. The first photodetector PD1 may detect light emitted from the first organic light-emitting diode ED1, the second organic light-emitting diode ED2, and the third organic light-emitting diode ED3 and reflected by an object, and sense the object.

Each organic light-emitting diode may include a pixel electrode, an opposite electrode, and an intermediate layer disposed therebetween. The photodetector may include a sensing electrode, a sensing opposite electrode, and an intermediate layer disposed therebetween. Accordingly, the first organic light-emitting diode ED1 may include a first pixel electrode 221*a*, the second organic light-emitting diode ED2 may include a second pixel electrode 221*c*, the third organic light-emitting diode ED3 may include a third pixel electrode 221*d*, and the first photodetector PD1 may include a first sensing electrode 221*b*. The first pixel electrode 221*a*, the second pixel electrode 221*c*, the third pixel electrode 221*d*, and the first sensing electrode 221*b* may be apart from one another above the substrate 100, e.g., refer to FIG. 5. In the present description, "in a plan view" refers to a plan view taken in a direction perpendicular to the substrate 100, i.e., in the Z-axis. That is, "A and B apart from each other in a plan view" refers to "A and B apart from each other in an X-Y plane defined by an X-axis and a Y-axis when viewed in a direction perpendicular to the substrate 100."

The bank layer 209 may be disposed on the first pixel electrode 221*a*, the second pixel electrode 221*c*, the third pixel electrode 221*d*, and the first sensing electrode 221*b* and may cover the edge of each of the first pixel electrode 221*a*, the second pixel electrode 221*c*, the third pixel electrode 221*d*, and the first sensing electrode 221*b*. That is, the bank layer 209 may have a first bank layer opening 209OP1 exposing a central portion of the first pixel electrode 221*a*, a second bank layer opening 209OP2 exposing a central portion of the first sensing electrode 221*b*, a third bank layer opening 209OP3 exposing a central portion of the second pixel electrode 221*c*, and a fourth bank layer opening 209OP4 exposing a central portion of the third pixel electrode 221*d*.

Although not shown in FIG. 4, emission layers for emitting light may be respectively located in the first bank layer opening 209OP1, the third bank layer opening 209OP3, and the fourth bank layer opening 209OP4 of the bank layer 209. Active layers for detecting light may be respectively located in the second bank layer opening 209OP2 of the bank layer 209. The opposite electrode and the sensing opposite electrode may be disposed above such emission layers and active layers. As described above, a stacked structure of a pixel electrode, an emission layer, and an opposite electrode may constitute one organic light-emitting diode. In addition, as described above, a stacked structure of a sensing electrode, an active layer, and a sensing opposite electrode may constitute one photodetector. One opening in the bank layer 209 may correspond to one organic light-emitting diode and may define one emission area. Alternatively, one opening in the bank layer 209 may correspond to one photodetector and may define one sensing area.

For example, an emission layer for emitting green light may be located in the first bank layer opening 209OP1. Thus, the first bank layer opening 209OP1 may define a first emission area EA1. Similarly, an emission layer for emitting red light may be located in the third bank layer opening 209OP3. Thus, the third bank layer opening 209OP3 may define a second emission area EA2. An emission layer for emitting blue light may be located in the fourth bank layer opening 209OP4. Thus, the fourth bank layer opening 209OP4 may define a third emission area EA3. An active layer for detecting light may be located in the second bank layer opening 209OP2. Thus, the second bank layer opening 209OP2 may define a first sensing area SA1.

Accordingly, a size of an area of the first bank layer opening 209OP1 is the same as a size of an area of the first emission area EA1. A size of an area of the second bank layer opening 209OP2 is the same as a size of an area of the first sensing area SA1. A size of an area of the third bank layer opening 209OP3 is the same as a size of an area of the second emission area EA2. A size of an area of the fourth bank layer opening 209OP4 is the same as a size of an area of the third emission area EA3.

Figure 5:
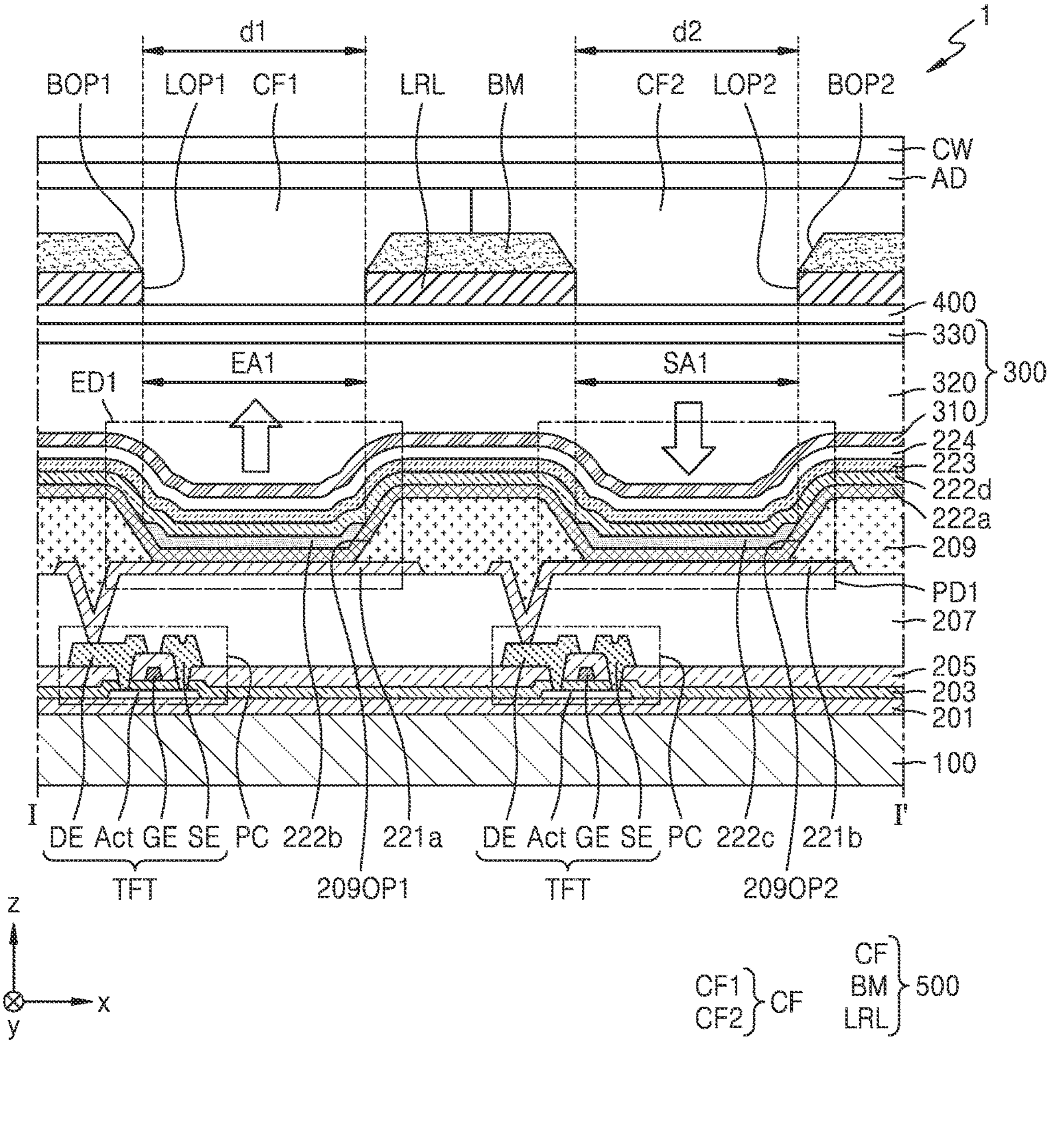
FIG. 5 is a schematic cross-sectional view of a portion of a display apparatus along a line I-I' of FIG. 4 according to an embodiment.

Each of the first bank layer opening 209OP1, the second bank layer opening 209OP2, the third bank layer opening 209OP3, and the fourth bank layer opening 209OP4 may have a polygonal shape when viewed in a direction, e.g., the z-axis direction, perpendicular to the substrate 100, e.g., refer to FIG. 5. In other words, each of the first emission area EA1, the second emission area EA2, the third emission area EA3, and the first sensing area SA1 may have a polygonal shape when viewed in a direction, e.g., the z-axis direction, perpendicular to the substrate 100. In FIG. 4, each of the first emission area EA1, the second emission area EA2, the third emission area EA3, and the first sensing area SA1 is shown as having a quadrilateral shape, more specifically, a quadrilateral shape with round corners, when viewed in a direction, e.g., the z-axis direction, perpendicular to the substrate 100. However, one or more embodiments are not limited thereto. For example, each of the first emission area EA1, the second emission area EA2, the third emission area EA3, and the first sensing area SA1 may have a circular shape or an oval shape when viewed in a direction, e.g., the z-axis direction, perpendicular to the substrate 100.

Figure 6:
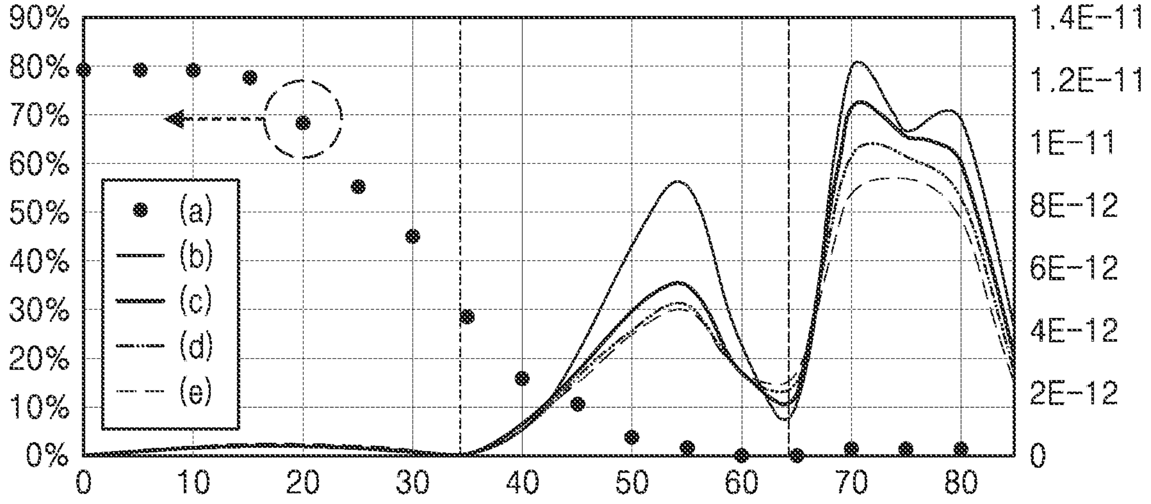
FIG. 6 is a graph in which the amount of light reaching a photodetector of a display apparatus according to an embodiment is compared according to an incident angle.

FIG. 5 is a schematic cross-sectional view of a portion of the display apparatus 1 along a line I-I' of FIG. 4 according to an embodiment. FIG. 6 is a graph in which the amount of light reaching a photodetector of a display apparatus according to an embodiment is compared according to an incident angle.

Referring to FIG. 5, the display apparatus 1 may include the substrate 100, a thin-film transistor TFT, the first organic light-emitting diode ED1, the first photodetector PD1, an auxiliary layer 224, an encapsulation layer 300, an input sensing layer 400, an anti-reflection layer 500, and the cover window CW.

The substrate 100 may include glass or polymer resin. For example, when the substrate 100 includes polymer resin, the substrate 100 may include one of polyimide, polyethylene naphthalate, polyethylene terephthalate, polyarylate, polycarbonate, polyetherimide and polyethersulfone.

A buffer layer 201 may be disposed on the substrate 100. The buffer layer 201 may reduce or prevent penetration of foreign materials, moisture, or external air from below the substrate 100. The buffer layer 201 may include an inorganic material, such as silicon oxide, silicon oxynitride and/or silicon nitride, and may include a single layer or a plurality of layers including the above-described material.

The thin-film transistor TFT may be disposed on the buffer layer 201. The thin-film transistor TFT may include a semiconductor layer ACT, a gate electrode GE, a source electrode SE, and a drain electrode DE. Although FIG. 5 shows a top gate type in which the gate electrode GE is disposed above the semiconductor layer Act with a gate insulating layer 203 therebetween, one or more embodiments are not limited thereto. For example, the thin-film transistor TFT may be a bottom gate type.

The semiconductor layer Act may be on the buffer layer 201. The semiconductor layer Act may include a channel region, and source and drain regions located at both sides of the channel region and doped with impurities. In this regard, the impurities may include N-type impurities or P-type impurities. The semiconductor layer Act may include amorphous silicon or polysilicon. In an embodiment, the semiconductor layer Act may include oxide of at least one material selected from the group including indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In addition, the semiconductor layer Act may include a Zn oxide-based material, such as Zn oxide, In—Zn oxide, Ga—In—Zn oxide, etc. In addition, the semiconductor layer Act may be an In—Ga—Zn—O (IGZO), In—Sn—Zn—O (ITZO), or In—Ga—Sn—Zn—O (IGTZO) semiconductor containing metal, such as indium (In), gallium (Ga), and stannum (Sn), in ZnO.

The gate electrode GE may be disposed above the semiconductor layer Act to at least partially overlap the semiconductor layer Act. More specifically, the gate electrode GE may overlap the channel region of the semiconductor layer Act. The gate electrode GE may include various conductive materials including molybdenum (Mo), aluminum (Al), copper (Cu), titanium (Ti), etc., and may have various layer structures. For example, the gate electrode GE may include a Mo layer and an Al layer or may have a multi-layer structure of Mo layer/Al layer/Mo layer. In addition, the gate electrode GE may have a multi-layer structure including an ITO layer covering a metal material.

The gate insulating layer 203 between the semiconductor layer Act and the gate electrode GE may include an inorganic insulating material, such as silicon oxide, silicon nitride, silicon oxynitride, aluminum oxide, titanium oxide, tantalum oxide, hafnium oxide, etc. The gate insulating layer 203 may include a single layer or a plurality of layers including the above-described material.

The source electrode SE and the drain electrode DE may be connected to the source region and the drain region of the semiconductor layer Act through contact holes. The source electrode SE and the drain electrode DE may include various conductive materials including molybdenum (Mo), aluminum (Al), copper (Cu), titanium (Ti), etc., and may have various layer structures. For example, the source electrode SE and the drain electrode DE may include a Ti layer and an Al layer or may have a multi-layer structure of Ti layer/Al layer/Ti layer. In addition, the source electrode SE and the drain electrode DE may have a multi-layer structure including an ITO layer covering a metal material.

An interlayer insulating layer 205 may include an inorganic insulating material, such as silicon oxide, silicon nitride, silicon oxynitride, aluminum oxide, titanium oxide, tantalum oxide, hafnium oxide, etc. In addition, the interlayer insulating layer 205 may include a single layer or a plurality of layers including the above-described material.

The gate insulating layer 203 and the interlayer insulating layer 205 including inorganic materials as described above may be formed through chemical vapor deposition (CVD) or atomic layer deposition (ALD), but one or more embodiments are not limited thereto.

The thin-film transistor TFT may be covered by an organic insulating layer 207. For example, the organic insulating layer 207 may cover the source electrode SE and the drain electrode DE. The organic insulating layer 207, which is a planarization insulating layer, may have a top surface that is approximately flat. The organic insulating layer 207 may include an organic insulating material, such as a general commercial polymer, such as polymethylmethacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. In an embodiment, the organic insulating layer 207 may include polyimide.

The first pixel electrode 221*a*, the first sensing electrode 221*b*, and the bank layer 209 may be disposed on the organic insulating layer 207. The bank layer 209 may cover the edge of the first pixel electrode 221*a* and the first sensing electrode 221*b* and may be disposed on the organic insulating layer 207.

The first bank layer opening 209OP1 extending to and exposing at least a central portion of the first pixel electrode 221*a* and the second bank layer opening 209OP2 extending to and exposing at least a central portion of the first sensing electrode 221*b* may be defined in the bank layer 209. Accordingly, the first bank layer opening 209OP1 may define the first emission area EA1, and the second bank layer opening 209OP2 may define the first sensing area SA1.

The bank layer 209 may prevent an arc, etc., from occurring at the edge of first pixel electrodes 221*a* by increasing a distance between the edge of the first pixel electrode 221*a* and an opposite electrode 223. In addition, the bank layer 209 may prevent an arc, etc., from occurring at the edge of first sensing electrodes 221*b* by increasing a distance between the edge of the first sensing electrode 221*b* and the opposite electrode 223.

The bank layer 209 may include an organic insulating material, such as polyimide, polyamide, acrylic resin, benzocyclobutene, hexamethyldisiloxane (HMDSO), and phenolic resin, and may be formed by a method, such as spin coating.

An emission layer 222*b* may be located in the first bank layer opening 209OP1 defined in the bank layer 209. The emission layer 222*b* may include an organic material including a fluorescent or phosphorescent material that emits red, green, blue, or white light. The emission layer 222*b* may be an organic emission layer including a low-molecular weight organic material or a polymer organic material. For example, the emission layer 222*b*, which is an organic emission layer, may include copper phthalocyanine, tris-8-hydroxyquinoline aluminum, a polyphenylene vinylene (PPV)-based material, or a polyfluorene-based material.

In an embodiment, the emission layer 222*b* may include a host material and a dopant material. The dopant material, which is a material that emits light of a certain color, may include a light-emitting material. The light-emitting material may include at least one of a phosphorescent dopant, a fluorescent dopant, and a quantum dot. The host material, which is a main material of the emission layer 222*b*, helps the dopant material to emit light.

An active layer 222*c* may be located in the second bank layer opening 209OP2 defined in the bank layer 209. The active layer 222*c* may include a p-type organic semiconductor and an n-type organic semiconductor. In this regard, the p-type organic semiconductor may serve as an electron donor, and the n-type organic semiconductor may serve as an electron acceptor.

In an embodiment, the active layer 222*c* may be a mixed layer in which the p-type organic semiconductor and the n-type organic semiconductor are mixed. In this case, the active layer 222*c* may be formed by co-depositing the p-type organic semiconductor and the n-type organic semiconductor. When the active layer 222*c* is a mixed layer, excitons may be generated within a diffusion length from a donor-acceptor interface.

In an embodiment, the p-type organic semiconductor may be a compound that serves as an electron donor for supplying electrons. For example, the p-type organic semiconductor may include boron subphthalocyanine chloride (SubPc), copper(II)phthalocyanine (CuPc), tetraphenyl dibenzoperiplantene (DBP), or any combination thereof, but one or more embodiments are not limited thereto.

In an embodiment, the n-type organic semiconductor may be a compound that serves as an electron acceptor for accepting electrons. For example, the n-type organic semiconductor may include C60 fullerene, C70 fullerene, or any combination thereof, but one or more embodiments are not limited thereto.

In an embodiment, the opposite electrode 223 may be disposed above the emission layer 222*b* and the active layer 222*c*. The opposite electrode 223 disposed above the emission layer 222*b* and the active layer 222*c* may be integrally formed. A portion of the opposite electrode 223 disposed above the active layer 222*c* may be referred to as a sensing opposite electrode. The opposite electrode 223 may be a light-transmitting electrode or a reflective electrode. In an embodiment, the opposite electrode 223 may be a transparent or semitransparent electrode and may include a metal thin film with a low work function including Li, Ca, LiF/Ca, LiF/Al, Al, Ag, Mg, and a compound thereof. The opposite electrode 223 may further include a transparent conductive oxide (TCO) film, such as ITO, IZO, ZnO, or In2O3, in addition to the metal thin film.

In an embodiment, a first common layer 222*a* may be disposed between the first pixel electrode 221*a* and the emission layer 222*b* and between the first sensing electrode 221*b* and the active layer 222*c*. A second common layer 222*d* may be disposed between the emission layer 222*b* and the opposite electrode 223 and between the active layer 222*c* and the opposite electrode 223.

In an embodiment, a hole transport region may be defined between the first pixel electrode 221*a* and the emission layer 222*b* and between the first sensing electrode 221*b* and the active layer 222*c*. An electron transport region may be defined between the emission layer 222*b* and the opposite electrode 223 and between the active layer 222*c* and the opposite electrode 223.

The hole transport region may have a single-layer structure or a multi-layer structure. For example, the first common layer 222*a* may be located in the hole transport region. In an embodiment, the first common layer 222*a* may include at least one of a hole injection layer (HIL), a hole transport layer (HTL), and an electron blocking layer (EBL).

For example, the first common layer 222*a* may have a single-layer structure or a multi-layer structure. When the first common layer 222*a* has a multi-layer structure, the first common layer 222*a* may include an HIL and an HTL, an HIL and an EBL, an HTL and an EBL, or an HIL, an HTL, and an EBL, which are sequentially stacked on the first pixel electrode 221*a*. However, one or more embodiments are not limited thereto.

The first common layer 222*a* may include at least one selected from among m-MTDATA, TDATA, 2-TNATA, NPB(NPD), β-NPB, TPD, Spiro-TPD, Spiro-NPB, methylated-NPB, TAPC, HMTPD, 4,4',4-tris(N-carbazolyl)triphenylamine (TCTA), polyaniline/dodecylbenzenesulfonic acid (Pani/DBSA), polyaniline/camphor sulfonic acid (Pani/CSA), poly(3,4-ethylenedioxythiophene)/poly(4-styrenesulfonate) (PEDOT/PSS), and polyaniline/poly(4-styrenesulfonate) (PANI/PSS).

The electron transport region may have a single-layer structure or a multi-layer structure. For example, the second common layer 222*d* may be located in the electron transport region. In an embodiment, the second common layer 222*d* may include at least one of an electron injection layer (EIL), an electron transport layer (ETL), and a hole blocking layer (HBL).

For example, the second common layer 222*d* may have a single-layer structure or a multi-layer structure. When the second common layer 222*d* has a multi-layer structure, the second common layer 222*d* may include an ETL and an EIL, an HBL and an EIL, an HBL and an ETL, or an HBL, an ETL, and an EIL, which are sequentially stacked on the emission layer 222*b*. However, one or more embodiments are not limited thereto.

The second common layer 222*d* may include at least one compound selected from among 2,9-Dimethyl-4,7-diphenyl-1,10-phenanthroline (BCP), 4,7-Diphenyl-1,10-phenanthroline (Bphen), Alq3, BAlq, 3-(Biphenyl-4-yl)-5-(4-tert-butylphenyl)-4-phenyl-4H-1,2,4-triazole (TAZ), and NTAZ.

The first organic light-emitting diode ED1 may include the first pixel electrode 221*a*, the first common layer 222*a*, the emission layer 222*b*, the second common layer 222*d*, and the opposite electrode 223 that are sequentially stacked. The first photodetector PD1 may include the first sensing electrode 221*b*, the first common layer 222*a*, the active layer 222*c*, the second common layer 222*d*, and the opposite electrode (sensing opposite electrode) 223 that are sequentially stacked.

The thin-film transistor TFT may be disposed between the substrate 100 and the first organic light-emitting diode ED1. The thin-film transistor TFT may be electrically connected to the first organic light-emitting diode ED1 to drive the first organic light-emitting diode ED1. For example, one of the source electrode SE and the drain electrode DE of the thin-film transistor TFT may be electrically connected to the first pixel electrode 221*a* of the first organic light-emitting diode ED1.

The thin-film transistor TFT may be disposed between the substrate 100 and the first photodetector PD1. The thin-film transistor TFT may be electrically connected to the first photodetector PD1 to drive the first photodetector PD1. For example, one of the source electrode SE and the drain electrode DE of the thin-film transistor TFT may be electrically connected to the first sensing electrode 221*b* of the first photodetector PD1.

The active layer 222*c* may receive light from the outside and generate excitons and then may separate the generated excitons into holes and electrons. When a (+) electric potential is applied to the first sensing electrode 221*b*, and a (−) electric potential is applied to the opposite electrode 223, the holes separated in the active layer 222*c* may move toward the opposite electrode 223, and the electrons separated in the active layer 222*c* may move toward the first sensing electrode 221*b*. Accordingly, a photocurrent may be formed in a direction from the first sensing electrode 221*b* to the opposite electrode 223.

When a bias is applied between the first sensing electrode 221*b* and the opposite electrode 223, a dark current may flow in the first photodetector PD1. In addition, when light is incident on the first photodetector PD1, a photocurrent may flow in the first photodetector PD1. In an embodiment, the first photodetector PD1 may detect an amount of light from a ratio of the photocurrent and the dark current.

The auxiliary layer 224 may be disposed on the first organic light-emitting diode ED1 and the first photodetector PD1. For example, the auxiliary layer 224 may be disposed on the opposite electrode 223. The auxiliary layer 224 may facilitate the movement of holes by lowering an energy barrier of holes moving in a direction toward an HTL and an anode. The auxiliary layer 224 may include, for example, a fluorene-based compound, a carbazole-based compound, a diarylamine-based compound, a triarylamine-based compound, a dibenzofuran-based compound, a dibenzothiophene-based compound, a dibenzosilol-based compound, or any combination thereof.

The encapsulation layer 300 may be disposed above the first organic light-emitting diode ED1 and the first photodetector PD1. For example, the encapsulation layer 300 may be disposed on the auxiliary layer 224. The encapsulation layer 300 may include at least one inorganic encapsulation layer and at least one organic encapsulation layer, and as an embodiment. FIG. 5 shows the encapsulation layer 300 including a first inorganic encapsulation layer 310, an organic encapsulation layer 320, and a second inorganic encapsulation layer 330 that are sequentially stacked.

The first inorganic encapsulation layer 310 and the second inorganic encapsulation layer 330 may include one or more inorganic materials among aluminum oxide, titanium oxide, tantalum oxide, hafnium oxide, zinc oxide, silicon oxide, silicon nitride, and silicon oxynitride. The organic encapsulation layer 320 may include a polymer-based material. Examples of the polymer-based material may include acryl-based resin, epoxy-based resin, polyimide, and polyethylene. In an embodiment, the organic encapsulation layer 320 may include acrylate. The organic encapsulation layer 320 may be formed by curing a monomer or applying a polymer. The organic encapsulation layer 320 may have transparency.

The input sensing layer 400 may be disposed on the encapsulation layer 300. The input sensing layer 400 may obtain an external input, for example, coordinate information according to a touch event. The input sensing layer 400 may include a plurality of touch electrodes and a touch insulating layer.

The anti-reflection layer 500 may be disposed on the input sensing layer 400. The anti-reflection layer 500 may include a low reflection layer LRL, a light-blocking layer BM, and a color filter CF. The color filter CF may include a first color filter CF1, and a second color filter CF2.

The light-blocking layer BM may be disposed above the input sensing layer 400. The light-blocking layer BM may at least partially absorb external light or internally reflected light. The light-blocking layer BM may include a black pigment. The light-blocking layer BM may be a black matrix. The light-blocking layer BM may include a first light-blocking layer opening BOP1 disposed above the first organic light-emitting diode ED1 and a second light-blocking layer opening BOP2 disposed above the first photodetector PD1. That is, the first light-blocking layer opening BOP1 may overlap the first emission area EA1, and the second light-blocking layer opening BOP2 may overlap the first sensing area SA1. An area of the first light-blocking layer opening BOP1 may be greater than or the same as an area of the first bank layer opening 209OP1 defined in the bank layer 209. In addition, an area of the second light-blocking layer opening BOP2 may be greater than or the same as an area of the second bank layer opening 209OP2 defined in the bank layer 209.

The low reflection layer LRL may be disposed between the input sensing layer 400 and the light-blocking layer BM. In this regard, the low reflection layer LRL may overlap the light-blocking layer BM, and a top surface of the low reflection layer LRL may be in direct contact with a bottom surface of the light-blocking layer BM. More specifically, the low reflection layer LRL may include a first low reflection layer opening LOP1 overlapping the first light-blocking layer opening BOP1 and a second low reflection layer opening LOP2 overlapping the second light-blocking layer opening BOP2.

The first light-blocking layer opening BOP1 and the first low reflection layer opening LOP1 may have the same area as each other. The second light-blocking layer opening BOP2 and the second low reflection layer opening LOP2 may have the same area as each other. That is, a distance d1 between light-blocking layers BM across the first light-blocking layer opening BOP1 and the distance d1 between low reflection layers LRL across the first low reflection layer opening LOP1 may be the same as each other. A distance d2 between light-blocking layers BM across the second light-blocking layer opening BOP2 and the distance d2 between low reflection layers LRL across the second low reflection layer opening LOP2 may be the same as each other.

In an embodiment, an area of the first light-blocking layer opening BOP1 may be the same as an area of the second light-blocking layer opening BOP2. In the same manner, an area of the first low reflection layer opening LOP1 may be the same as an area of the second low reflection layer opening LOP2. That is, the distance d1 between light-blocking layers BM across the first light-blocking layer opening BOP1 and the distance d2 between light-blocking layers BM across the second light-blocking layer opening BOP2 may be the same as each other.

The low reflection layer LRL may have a lower surface reflectance than the light-blocking layer BM. The low reflection layer LRL having a lower surface reflectance than the light-blocking layer BM is disposed under the light-blocking layer BM. Accordingly, the low reflection layer LRL may reduce internal light reflectance due to the light-blocking layer BM.

As described above, as light emitted from the first organic light-emitting diode ED1 is reflected from a user's fingerprint and re-incident on the first photodetector PD1, the first photodetector PD1 may detect the reflected light. However, because the light-blocking layer BM has a high surface reflectance, a portion of light emitted from the first organic light-emitting diode ED1 may reach the light-blocking layer BM, may be reflected from a surface of the light-blocking layer BM, and may be re-incident on the first photodetector PD1. Such internally reflected light is not reflected from the user's fingerprint, and thus may act as noise of the first photodetector PD1 and degrade detectability of the first photodetector PD1.

However, as in a display apparatus according to an embodiment, when the low reflection layer LRL having a low surface reflectance is disposed under the light-blocking layer BM, noise may be reduced by reducing internal light reflectance of a display apparatus. More specifically, even when some light from light emitted from the first organic light-emitting diode ED1 has an incident angle toward the light-blocking layer BM, the low reflection layer LRL having a low surface reflectance may absorb the corresponding light to reduce internally reflected light because the low reflection layer LRL is disposed under the light-blocking layer BM.

In an embodiment, a thickness of the low reflection layer LRL may be 0.1 μm to 10 μm. For example, a thickness of the low reflection layer LRL may be 0.5 μm to 1.5 μm. In this regard, a refractive index of the low reflection layer LRL may be 1.5 to 2.0. By adjusting the above thickness and refractive index of the low reflection layer LRL, internally reflected light of a display apparatus may be minimized.

Hereinafter, internal light reflection reduction of a display apparatus according to an embodiment will be described with reference to FIG. 6. FIG. 6 is a graph in which, among light emitted from an organic light-emitting diode, light reaching a detector is compared according to an incident angle. The horizontal axis of FIG. 6 represents an incident angle (in degrees, °) with respect to a photodetector. In FIG. 6, the left vertical axis represents an amount of light of fingerprint reflected light, and the right vertical axis represents an amount of light of internally reflected light. In this regard, data (a) represents a rate of fingerprint reflected light absorbed by the photodetector, and data (b), (c), (d), and (e) represent an amount of light of internally reflected light reaching the photodetector. Data (b) is the result of a comparative example in which only the light-blocking layer BM is provided without the low reflection layer LRL, and data (c) is the result of an embodiment in which the low reflection layer LRL having a thickness of 0.5 μm is provided. Data (d) is the result of an embodiment in which the low reflection layer LRL having a thickness of 1 μm is provided, and data (e) is the result of an embodiment in which the low reflection layer LRL having a thickness of 1.5 μm is provided.

Referring to data (a) of FIG. 6, fingerprint reflected light absorbed by the photodetector has an incident angle of 0° to 45°. Particularly, when the fingerprint reflected light has an incident angle of 20° or less, it may be confirmed that the absorption rate of the photodetector is 70% or greater. Through this, it may be seen that light emitted from an organic light-emitting diode at an angle of 0° to 45° is reflected by a user's fingerprint and absorbed by the photodetector as fingerprint reflected light, and the smaller the angle of the emitted light, the higher the absorption rate of the photodetector. On the other hand, referring to data (b) of FIG. 6, internally reflected light reaching the photodetector has an incident angle of 45° or greater. More specifically, when the internally reflected light has an incident angle of 45° to 60° or an incident angle of 70° to 80°, it may be confirmed that an amount of light reaching the photodetector is high. Through this, it may be seen that light emitted from the organic light-emitting diode at an angle of 45° or greater is reflected by the light-blocking layer BM and reaches the photodetector as internally reflected light, which may act as noise.

In this regard, referring to data (c), (d), and (e) of FIG. 6, when the low reflection layer LRL is disposed under the light-blocking layer BM, it may be confirmed that internally reflected light reaching the photodetector is reduced. That is, when the low reflection layer LRL is disposed under the light-blocking layer BM, light emitted from the organic light-emitting diode at an angle of 45° or greater may have surface reflectance partially absorbed by the low reflection layer LRL. Thus, a smaller amount of light may reach the photodetector. Particularly, it may be confirmed that an amount of light reaching the photodetector is reduced when the low reflection layer LRL having a thickness of 1.0 μm is provided compared to when the low reflection layer LRL having a thickness 0.5 μm is provided, and an amount of light reaching the photodetector is further reduced when the low reflection layer LRL having a thickness of 1.5 μm is provided compared to when the low reflection layer LRL having a thickness 1.0 μm is provided. Through this, it may be seen that, as a thickness of the low reflection layer LRL increases, surface reflectance of the low reflection layer LRL decreases, thus reducing internally reflected light reaching the photodetector and improving detectability of the photodetector.

The low reflection layer LRL may be a third color filter that absorbs light in a different wavelength range from the wavelength range of the first color filter CF1 and the wavelength range of the second color filter CF2 described below. In an embodiment, the low reflection layer LRL may be a blue color filter that is capable of transmitting light in a wavelength band of 380 nm to 495 nm. More specifically, the low reflection layer LRL may include a first pigment that is a known blue pigment. In an embodiment, the first pigment may include at least one of C. I. Pigment Blue 15, 15:1, 15:2, 15:3, 15:4, and 15:6. For example, the first pigment may include C. I. Pigment Blue 15:6 having excellent luminance characteristics.

However, the low reflection layer LRL does not include only a blue pigment, and may further include a second pigment, such as a red pigment, a yellow pigment, a green pigment, a violet pigment, etc. In an embodiment, C.I. Pigment Red 254 may be used as the red pigment, C.I. Pigment Green 36, 58, and 59 may be used as the green pigment, C.I. Pigment Yellow 138 may be used as the yellow pigment, and Pigment Violet 23 may be used as the violet pigment. However, the included pigments are not limited thereto, and various pigments may be used. For example, the violet pigment may include at least one of C. I. Pigment Violet 1, 19, 23, 27, 29, 30, 32, 37, 40, 42, and 50. A red pigment, a yellow pigment, a violet pigment, etc., described above may be further included. Thus, a wavelength absorbed by the low reflection layer LRL may be adjusted.

In an embodiment, the low reflection layer LRL may further include a second pigment that is a violet pigment, in addition to a first pigment that is a blue pigment. When the low reflection layer LRL further includes a violet pigment, light in a shorter wavelength band may be transmitted compared to when the low reflection layer LRL includes only a blue pigment. That is, when the low reflection layer LRL further includes a violet pigment, a wavelength value of light having the longest wavelength among light that the low reflection layer LRL may transmit is lowered. This means that an overlapping region between a wavelength band of green light emitted from the first organic light-emitting diode ED1 and a wavelength band of light transmitted by the low reflection layer LRL, which is a blue color filter, is reduced. Accordingly, the low reflection layer LRL described above may absorb more of the green light emitted from the first organic light-emitting diode ED1, further reducing internally reflected light reaching the photodetector and effectively reducing noise.

Referring back to FIG. 5, the first color filter CF1 and the second color filter CF2 may be disposed on the low reflection layer LRL and the light-blocking layer BM. The first color filter CF1 and the second color filter CF2 may transmit only light having a wavelength in a certain band.

The first color filter CF1 may transmit light emitted from the first organic light-emitting diode ED1. For example, when the first organic light-emitting diode ED1 emits green light, the first color filter CF1 may be a green color filter that transmits green light. In addition, when the first organic light-emitting diode ED1 emits red light, the first color filter CF1 may be a red color filter that transmits red light.

The second color filter CF2 may transmit light of the same color as the first color filter CF1. When the first color filter CF1 is a green color filter, the second color filter CF2 may be a green color filter. In addition, when the first color filter CF1 is a red color filter, the second color filter CF2 may be a red color filter.

That is, in an embodiment, the first color filter CF1 and the second color filter CF2 may be green color filters that transmit green light in the same way. More specifically, the first color filter CF1 and the second color filter CF2 may be green color filters that transmit light in a wavelength band of 495 nm to 600 nm.

The cover window CW may be disposed above the anti-reflection layer 500. The cover window CW may include at least one of glass, sapphire, and plastic. The cover window CW may be, for example, Ultra-Thin Glass (UTG) or Colorless Polyimide (CPI).

An adhesive member AD may be disposed between the cover window CW and the anti-reflection layer 500. Accordingly, the adhesive member AD may couple the cover window CW and the anti-reflection layer 500 to each other. As the adhesive member AD, a general one known in the art may be employed without limitation. The adhesive member AD may be a pressure-sensitive adhesive (PSA).

Figure 7:
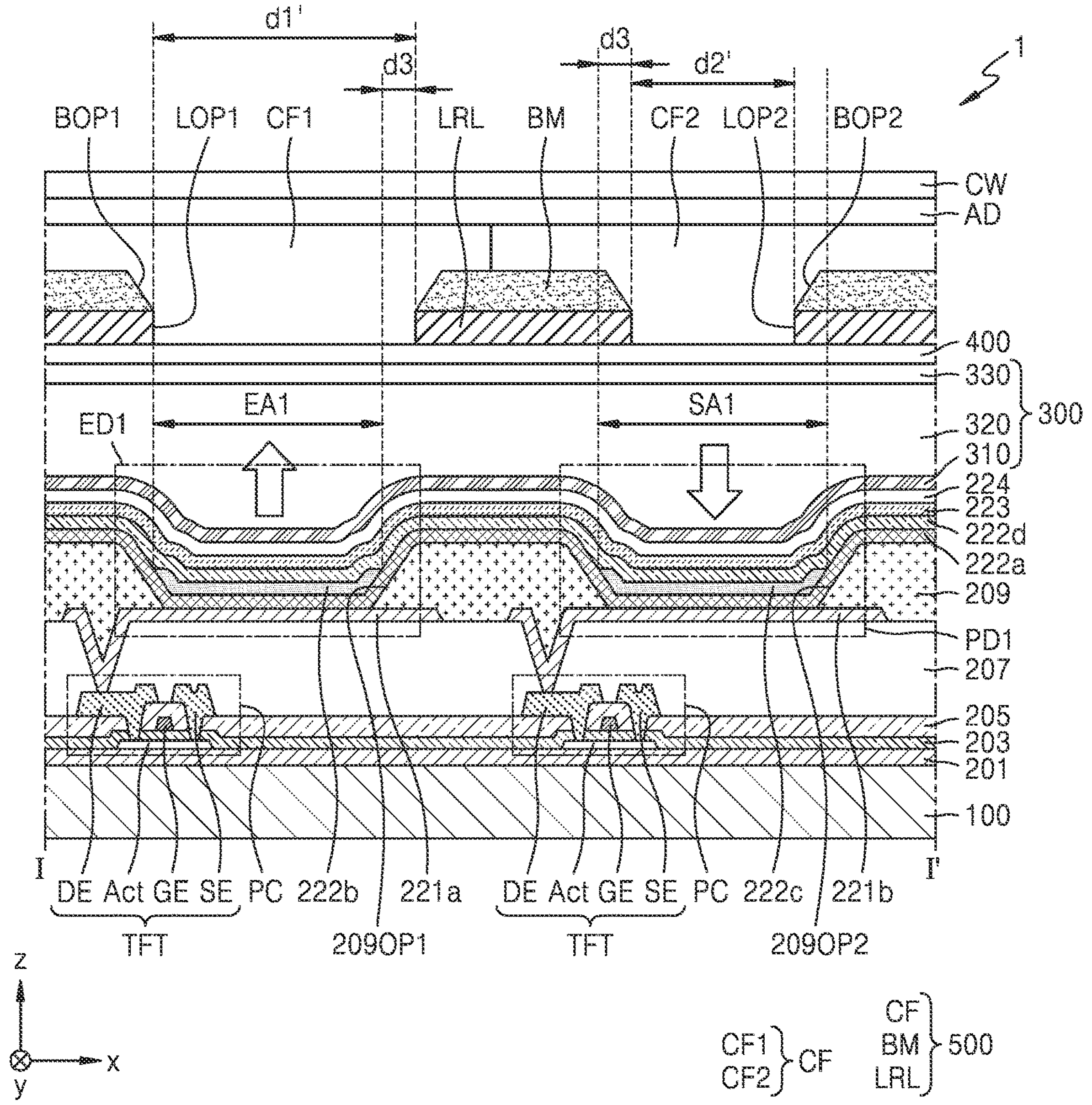
FIG. 7 is a schematic cross-sectional view of a display apparatus according to an embodiment.

FIG. 7 is a schematic cross-sectional view of the display apparatus 1 according to an embodiment. Referring to FIG. 7, except for characteristics of the anti-reflection layer 500, other characteristics are the same as those described with reference to FIGS. 5 and 6. Among the elements of FIG. 7, the same reference numerals are replaced with those described above with reference to FIGS. 5 and 6, and differences are mainly described below.

Referring to FIG. 7, the anti-reflection layer 500 may include the low reflection layer LRL, the light-blocking layer BM, the first color filter CF1, and the second color filter CF2.

As described above with reference to FIG. 5, the light-blocking layer BM may be disposed above the input sensing layer 400. The light-blocking layer BM may include the first light-blocking layer opening BOP1 disposed above the first organic light-emitting diode ED1 and the second light-blocking layer opening BOP2 disposed above the first photodetector PD1. That is, the first light-blocking layer opening BOP1 may overlap the first emission area EA1, and the second light-blocking layer opening BOP2 may overlap the first sensing area SA1.

The low reflection layer LRL may be disposed between the input sensing layer 400 and the light-blocking layer BM. In this regard, the low reflection layer LRL may overlap the light-blocking layer BM, and a top surface of the low reflection layer LRL may be in direct contact with a bottom surface of the light-blocking layer BM. More specifically, the low reflection layer LRL may include the first low reflection layer opening LOP1 overlapping the first light-blocking layer opening BOP1 and the second low reflection layer opening LOP2 overlapping the second light-blocking layer opening BOP2.

The first light-blocking layer opening BOP1 and the first low reflection layer opening LOP1 may have the same area as each other, and the second light-blocking layer opening BOP2 and the second low reflection layer opening LOP2 may have the same area as each other. That is, a distance d1' between light-blocking layers BM across the first light-blocking layer opening BOP1 and the distance d1' between low reflection layers LRL across the first low reflection layer opening LOP1 may be the same as each other. A distance d2' between light-blocking layers BM across the second light-blocking layer opening BOP2 and the distance d2' between low reflection layers LRL across the second low reflection layer opening LOP2 may be the same as each other.

However, in an embodiment, an area of the first light-blocking layer opening BOP1 may be greater than an area of the second light-blocking layer opening BOP2. In the same manner, an area of the first low reflection layer opening LOP1 may be greater than an area of the second low reflection layer opening LOP2. That is, the distance d1' between light-blocking layers BM across the first light-blocking layer opening BOP1 may be greater than the distance d2' between light-blocking layers BM across the second light-blocking layer opening BOP2.

More specifically, the light-blocking layer BM and the low reflection layer LRL surrounding the first photodetector PD1 may be closer inward in the X-Y plane to the first sensing area SA1, e.g., to the center of the first sensing area SA1, than the bank layer 209 overlappingly disposed below. That is, the light-blocking layer BM and the low reflection layer LRL surrounding the first sensing area SA1 may be apart from the bank layer 209 overlappingly disposed below by a certain distance d3. That is, the light-blocking layer BM and the low reflection LRL between the first emission area EA1 and the first sensing area SA1 are shifted in the direction of the first sensing area SA1 by the length of d3. Accordingly, some of the light-blocking layer BM and the low reflection layer LRL surrounding EA1 may be recessed in the direction of the first sensing area SA1 form the bank layer 209 by the length of d3. In this regard, the certain distance d3 may be 4 μm to 5 μm.

Accordingly, an end of the light-blocking layer BM surrounding the second light-blocking layer opening BOP2 and facing the second light-blocking layer opening BOP2 may protrude farther inward into the first sensing area SA1 than an end of the bank layer 209 surrounding the second bank layer opening 209OP2 and facing the second bank layer opening 209OP2 in a cross-sectional view. An end of the light-blocking layer BM facing the first sensing area SA1 may protrude farther than an end of the bank layer 209 facing the first sensing area SA1 by 4 μm to 5 μm.

A display apparatus according to an embodiment may have the resolution of the first photodetector PD1 improved. The resolution of the first photodetector PD1 may be determined by a resolving distance, which is a distance between both ends of light reaching the first photodetector PD1 on the cover window CW. Accordingly, as a size of the first photodetector PD1 itself decreases, or as an area of the second light-blocking layer opening BOP2 overlapping the first sensing area SA1 decreases, the resolution of the first photodetector PD1 may improve. In this regard, in the display apparatus shown in FIG. 7, the light-blocking layer BM and the low reflection layer LRL may be apart by the certain distance d3, and thus, the resolving distance d2' across the second light-blocking layer opening BOP2 may be reduced. That is, in a display apparatus according to an embodiment, an area of the second light-blocking layer opening BOP2 may be reduced, and accordingly, a user's fingerprint, etc., may be sensed more precisely by improving the resolution.

In a display apparatus according to one or more of the above embodiments, internal light reflectance may be reduced by disposing a low reflection layer under a light-blocking layer, and thus, noise of a sensor may be reduced, and detectability may be improved. However, the above effect is an example, and one or more embodiments are not limited by such an effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:

a substrate comprising a first emission area and a first sensing area;

a first organic light-emitting diode above the substrate and emitting light in correspondence with the first emission area;

a first photodetector above the substrate and detecting light in correspondence with the first sensing area;

a light-blocking layer above the first organic light-emitting diode and the first photodetector and comprising a first light-blocking layer opening overlapping the first emission area and a second light-blocking layer opening overlapping the first sensing area;

a low reflection layer above the first organic light-emitting diode and the first photodetector and under the light-blocking layer;

a first color filter on the light-blocking layer and filling the first light-blocking layer opening; and a second color filter on the light-blocking layer and filling the second light-blocking layer opening, wherein the light-blocking layer overlaps the low reflection layer.

2. The display apparatus of claim 1, wherein a top surface of the low reflection layer is in direct contact with a bottom surface of the light-blocking layer.

3. The display apparatus of claim 2, wherein the low reflection layer comprises a first low reflection layer opening overlapping the first light-blocking layer opening and a second low reflection layer opening overlapping the second light-blocking layer opening.

4. The display apparatus of claim 3, wherein the first light-blocking layer opening and the first low reflection layer opening have a same area as each other, and the second light-blocking layer opening and the second low reflection layer opening have a same area as each other.

5. The display apparatus of claim 1, wherein the low reflection layer has a surface reflectance lower than a surface reflectance of the light-blocking layer.

6. The display apparatus of claim 1, wherein the low reflection layer is a third color filter that absorbs light in a wavelength range different from a wavelength range of the first color filter and a wavelength range of the second color filter.

7. The display apparatus of claim 6, wherein the low reflection layer is a blue color filter that is capable of transmitting light in a wavelength band of 380 nm to 495 nm.

8. The display apparatus of claim 6, wherein the low reflection layer comprises a first pigment, wherein the first pigment comprises at least one of C. I. Pigment Blue 15, 15:1, 15:2, 15:3, 15:4, and 15:6.

9. The display apparatus of claim 8, wherein the low reflection layer further comprises a second pigment, wherein the second pigment comprises at least one of C. I. Pigment Violet 1, 19, 23, 27, 29, 30, 32, 37, 40, 42, and 50.

10. The display apparatus of claim 1, wherein the first color filter and the second color filter transmit light of a same color.

11. The display apparatus of claim 10, wherein the first color filter and the second color filter are green color filters that transmit light in a wavelength band of 495 nm to 600 nm.

12. The display apparatus of claim 1, wherein an area of the first light-blocking layer opening is the same as an area of the second light-blocking layer opening.

13. The display apparatus of claim 1, wherein an area of the first light-blocking layer opening is greater than an area of the second light-blocking layer opening.

14. The display apparatus of claim 1, further comprising a bank layer comprising a first bank layer opening overlapping the first light-blocking layer opening and a second bank layer opening overlapping the second light-blocking layer opening.

15. The display apparatus of claim 14, wherein an end of the light-blocking layer surrounding the second light-blocking layer opening and facing the second light-blocking layer opening protrudes farther inward into the first sensing area than an end of the bank layer surrounding the second bank layer opening and facing the second bank layer opening in a cross-sectional view.

16. The display apparatus of claim 15, wherein an end of the bank layer surrounding the first bank layer opening and facing the first bank layer opening protrudes farther than an end of the light-blocking layer surrounding the first light-blocking layer opening and facing the first light-blocking layer opening by 4 μm to 5 μm.

17. The display apparatus of claim 1, wherein a thickness of the low reflection layer is 0.1 μm to 10 μm.

18. The display apparatus of claim 1, wherein a refractive index of the low reflection layer is 1.5 to 2.0.

19. The display apparatus of claim 1, wherein the first organic light-emitting diode emits green light in a wavelength band of 495 nm to 580 nm, and the first photodetector detects green light in the wavelength band of 495 nm to 580 nm.

20. The display apparatus of claim 1, further comprising:

an adhesive member on the first color filter and the second color filter; and a cover window on the adhesive member.

* * * * *